United States Patent
Franca-Neto et al.

(10) Patent No.: US 6,982,879 B1
(45) Date of Patent: Jan. 3, 2006

(54) APPARATUS TO PROVIDE CONNECTION BETWEEN A MICROELECTRONIC DEVICE AND AN ANTENNA

(75) Inventors: Luiz M. Franca-Neto, Hillsboro, OR (US); Bradley A. Bloechel, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/623,319

(22) Filed: Jul. 19, 2003

(51) Int. Cl.
*H01Q 1/22* (2006.01)
*H05K 7/06* (2006.01)

(52) U.S. Cl. .................. 361/803; 361/749; 361/767; 361/780; 361/783; 343/700 MS; 343/702

(58) Field of Classification Search ........ 361/749–751, 361/760, 767, 768, 771, 780, 782–784, 803; 343/700 MS, 872, 873, 702; 257/664, 728
See application file for complete search history.

(56) References Cited

U.S. PATENT DOCUMENTS

| | | | |
|---|---|---|---|
| 5,313,365 A * | 5/1994 | Pennisi et al. | 361/760 |
| 5,666,272 A * | 9/1997 | Moore et al. | 361/735 |
| 5,861,853 A * | 1/1999 | Haub et al. | 343/702 |
| 5,936,584 A * | 8/1999 | Lawrence et al. | 343/702 |
| 6,335,669 B1 * | 1/2002 | Miyazaki et al. | 333/247 |
| 6,342,869 B1 * | 1/2002 | Edvardsson et al. | 343/841 |
| 6,570,469 B2 * | 5/2003 | Yamada et al. | 333/193 |
| 6,774,847 B1 * | 8/2004 | Epstein et al. | 343/700 MS |
| 2002/0171591 A1 * | 11/2002 | Beard | 343/702 |

* cited by examiner

*Primary Examiner*—John B. Vigushin
(74) *Attorney, Agent, or Firm*—The Law Offices of John C. Scott, LLC (57) ABSTRACT

Techniques and structures are disclosed for providing interface and radio frequency (RF) network between a microelectronic device and an antenna.

37 Claims, 5 Drawing Sheets

APPARATUS TO PROVIDE CONNECTION BETWEEN A MICROELECTRONIC DEVICE AND AN ANTENNA

FIELD OF THE INVENTION

The invention relates generally to microelectronic devices and, more particularly, to microelectronic devices having wireless communication capability.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
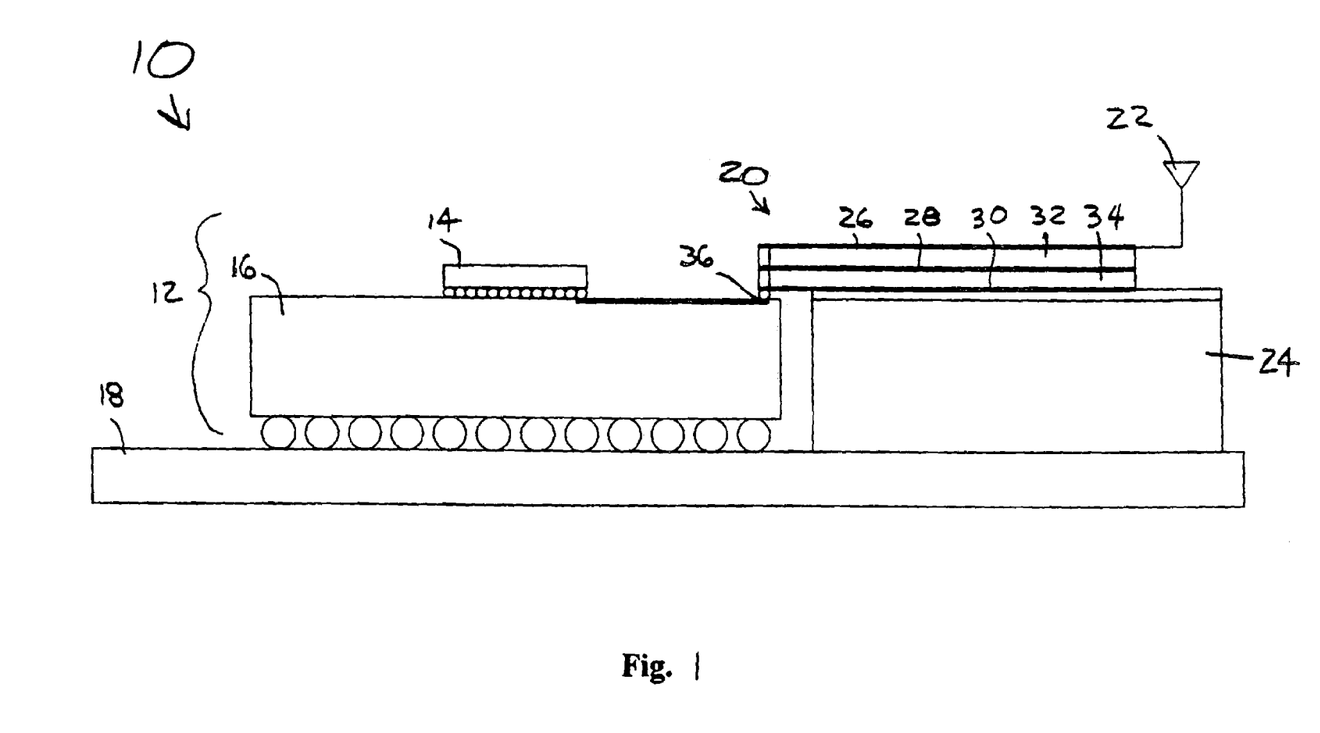
FIG. 1 is a side view of an example system having wireless capability in accordance with an embodiment of the present invention.

FIG. 1 is a side view of an example system 10 having wireless capability in accordance with an embodiment of the present invention. The system 10 may be virtually any type of wireless apparatus, device, or system that requires interconnection between a microelectronic device (e.g., an integrated circuit) and an antenna. For example, in at least one implementation, the system 10 is part of a wireless network interface card (NIC). In other implementations, the system 10 may be part of a desktop, laptop, palmtop, or tablet computer, a personal digital assistant (PDA), a cellular telephone or other handheld communicator, a pager, a global positioning system (GPS) receiver, and/or other wireless systems. As illustrated, the system 10 may include one or more of: a microelectronic device 12 having a microelectronic die 14 and a package 16, a circuit board 18, an antenna interface circuit 20, an antenna 22, and a support 24. The package 16 may provide, among other things, an electrical interface between the die 14 and the underlying circuit board 18. The microelectronic die 14 is mounted on an upper side of the package 16. The package 16 is coupled to the circuit board 18 at a lower side thereof. In at least one implementation, the microelectronic die 14 includes wireless circuitry for supporting, for example, wireless communication with a remote entity. The microelectronic die 14 may also include, for example, digital processing circuitry (e.g., a digital processor with integrated wireless functionality) and/or other types of circuitry. In other embodiments, multiple microelectronic dice are provided on the same package structure (e.g., a digital processor chip and a separate wireless chip, etc.). The antenna interface circuit 20 provides an interface between the microelectronic device 12 and the antenna 22. The optional support 24 provides mechanical support for the antenna interface circuit 20. As in the illustrated embodiment, the support 24 may be located between the antenna interface circuit 20 and the circuit board 18. Many alternative arrangements also exist.

In at least one embodiment of the invention, the microelectronic die 14 is connected to the package carrier (e.g., substrate, lead frame, etc.) using flip chip techniques, although other alternative techniques may also be used (e.g., wire bond, chip scale package (CSP), etc.). The electrical interconnection between the package 16 and the circuit board 18 (or other similar structure) may be made in any known manner (e.g., ball grid array (BGA), pin grid array (PGA), land grid array (LGA), conventional leaded connections, leadless connections, socket mount, surface mount, through hole mount, and others). The circuit board 18 may include, for example, a motherboard or any other structure upon which circuitry is mounted.

As described above, the antenna interface circuit 20 provides an interface between the microelectronic device 12 and the antenna 22. The microelectronic device 12 may include wireless communication functionality (e.g., a wireless transmitter and/or a wireless receiver, etc.) for communicating with a remote entity through the antenna 22. As shown in FIG. 1, in at least one embodiment of the present invention, the antenna interface circuit 20 connects to one or more terminals 36 on an upper side of the package 16 (i.e., a side opposite the side that couples to the underlying circuit board 18) to provide a signal path between the microelectronic device 12 and the antenna 22. The interconnection between the antenna interface circuit 20 and the package 16 may be made in any of a variety of different manners including the use of flip chip techniques, BGA, PGA, LGA, spring board connections, surface mount techniques, leadless connections, and/or many others. The connection between the microelectronic die 14 and the one or more terminals 36 on the upper side of the package 16 that interface with the antenna interface circuit 20 can be made in any known manner. For example, in one approach, the connection may be made using one or more conductive traces on an upper metallization layer of the package 16 (as shown in FIG. 1). In another approach, multi-layer connections (with associated vias) may be used. The number of terminals 36 on the upper side of the package 16 will typically depend upon the actual circuit components that are included within the antenna interface circuit 20. It should be appreciated that more than one antenna may be used or multiple signaling paths may be implemented in accordance with the present invention. As used herein, the word "terminal" and the phrase "electrical terminal" refer to any conductive structure to which an external electrical connection can be made (e.g., a bond pad, a contact pad, a solder ball or bump, a pin, etc.).

The wireless transmitter within the device 12 (if any) may include a power amplifier that requires an impedance transformer between it and the antenna 22. The wireless receiver within the device 12 (if any) may include a low noise amplifier (LNA) at a front end thereof that requires an input matching network between it and the antenna 22. A duplexer structure may also be desired to allow a wireless transmitter and a wireless receiver to share the antenna 22. In at least one embodiment of the present invention, a power amplifier impedance transformer, an LNA input matching network, and/or a duplexer are implemented within the antenna interface circuit 20.

As illustrated in FIG. 1, in at least one embodiment of the present invention, the antenna interface circuit 20 is a circuit structure having multiple metallization layers that are separated from one another by dielectric layers. The circuitry may be implemented in any of a variety of different ways including, for example, microstrip, stripline, coplanar waveguide (CPW), conductor backed coplanar waveguide (CBCPW), and/or others, and may include combinations of different techniques. A CBCPW implementation may utilize, for example, two layers of metallization with precisely placed vias connecting a ground plane to a ground structure alongside the signal path. In the illustrated embodiment, the circuit 20 has first, second, and third metallization layers 26, 28, 30 separated from one another by two intervening dielectric layers 32, 34. The first metallization layer 26 may include, for example, metallization forming an impedance transformer for a power amplifier within the microelectronic device 12, the third metallization layer 30 may include, for example, metallization forming an input matching network for an LNA within the microelectronic device 12, and the second metallization layer 28 may include, for example, a ground plane. In another possible implementation, first and third metallization layers 26, 30 may each include a ground plane and second metallization layer 28 may be the signaling layer. Other configurations may alternatively be used.

A duplexer structure may also be implemented within the antenna interface circuit 20 on any one of the layers (or divided among several layers). In another embodiment, the metallization forming the power amplifier impedance transformer, the metallization forming the LNA input matching network, and the metallization forming the duplexer are all implemented on a common metallization layer within the antenna interface circuit 20. In other embodiments, the antenna interface circuit 20 includes only duplexer metallization or duplexer metallization along with integrated antenna metallization. In a system that includes only a wireless transmitter or only a wireless receiver, the antenna interface circuit 20 may include metallization for only a corresponding one of the power amplifier impedance transformer or the LNA input matching network (and possibly integrated antenna metallization). In a system that has separate transmit and receive antennas, the antenna interface circuit 20 may include metallization for both a power amplifier impedance transformer and an LNA input matching network, but no duplexer metallization. As will be appreciated, many alternative arrangements also exist. Any number of metallization layers may be used.

The design of the metallization portions that act as the power amplifier impedance transformer, the LNA input matching network, and/or the duplexer may be performed in a conventional manner and, therefore, will not be discussed further. By moving the power amplifier impedance transformer, LNA input matching network, and/or the duplexer to the antenna interface circuit 20, as is performed in some (but not all) of the embodiments of the invention, much higher quality (Q) factors may be realized than would be possible if these structures were implemented on die. Also, by providing a connection point for the antenna interface circuit 20 on an upper side of the package 16, as is performed in some (but not all) of the embodiments of the invention, radio frequency (RF) signal paths extending through the substrate of the package 16 (e.g., through vias and normal package pins and possibly requiring DC bias: traces and bypass capacitors) can be avoided. In addition, by providing the antenna connection on the upper side of the package 16, new wireless circuitry may be added to an existing digital chip (e.g., a microprocessor chip, etc.) without requiring extra pins on the associated package and a backward-pin-compatible device having wireless capability may be produced.

The antenna 22 may be a separate structure that is coupled to a port of the antenna interface circuit 20 or, alternatively, the antenna 22 may be an integral part of the antenna interface circuit 20. For example, in at least one approach, a microstrip antenna is implemented using metallization on at least one of the metallization layers of the circuit 20. Any type of antenna may be used including, for example, a patch, a helix, an array, and/or others. The dielectric layers 32, 34 may be implemented in any known manner including, for example, using off-the-shelf board materials, deposited insulation materials, etc. In at least one embodiment, the antenna interface circuit 20 is formed by laminating two or more separate dielectric boards together.

Figure 2:
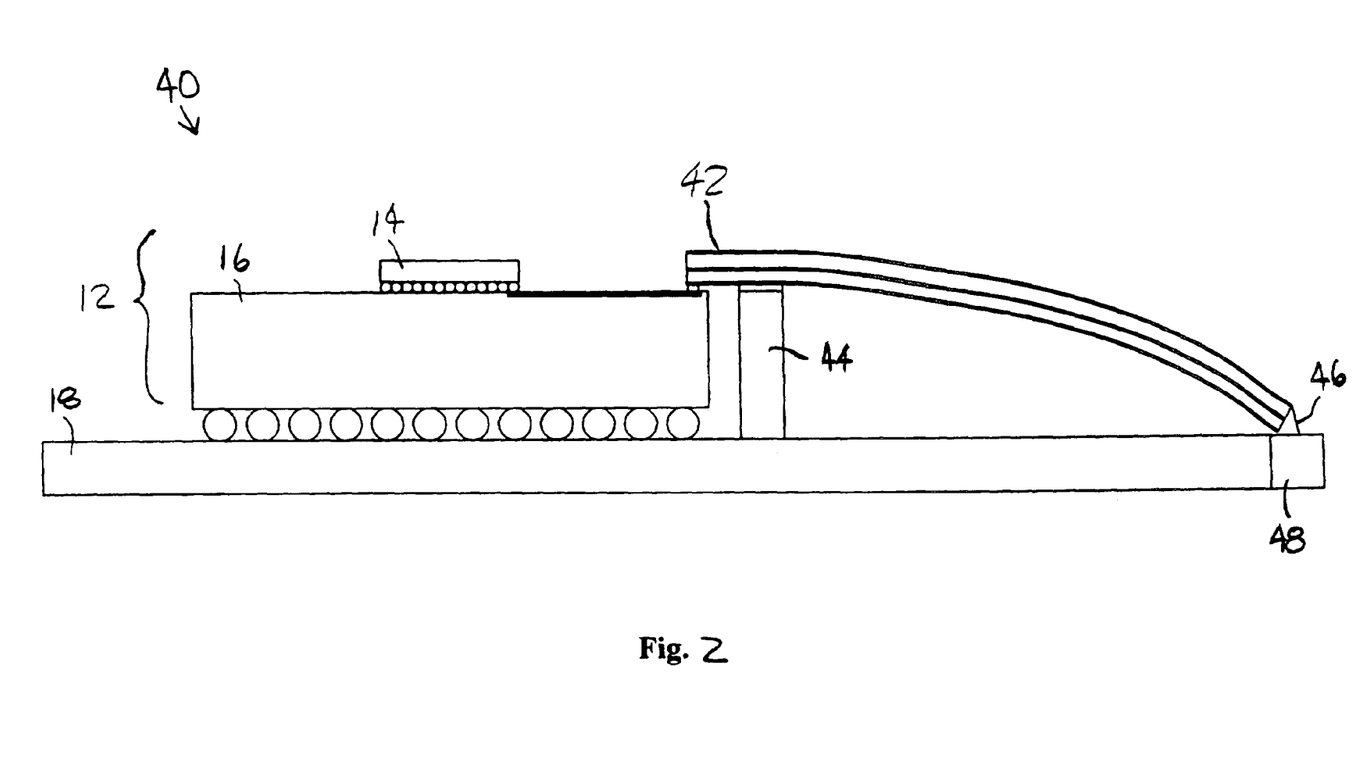
FIG. 2 is a side view of an example system having wireless capability in accordance with another embodiment of the present invention.

FIG. 2 is a side view of an example system 40 having wireless capability in accordance with an embodiment of the present invention. In the system 40 of FIG. 2, a flexible antenna interface circuit 42 is provided. The flexible antenna interface circuit 42 may utilize, for example, flexible dielectric board material and metallization material. A flexible antenna interface circuit 42 may provide benefits such as, for example, easier mechanical assembly, increased durability, relief of mechanical stress, increased resistance to problems caused by materials having different coefficients of expansion, and/or other benefits. The flexible antenna interface circuit 42 may connect to the microelectronic device 12 as described previously. In the embodiment illustrated in FIG. 2, a support 44 is provided to lend mechanical support to the flexible antenna interface circuit 42. A connection 46 is made from the flexible antenna interface circuit 42 to an antenna 48. In the illustrated embodiment, the antenna 48 is mounted on an end of the circuit board 18, although many alternative mounting locations and techniques also exist. An end-mounted antenna 48 may be useful in a wireless NIC card implementation, for example, where it is desired that the antenna extend outside of a host device (e.g., a laptop, desktop, palmtop, or tablet computer, etc.) after the card has been installed. Many other antenna configurations also exist. In at least one approach, the antenna is implemented using microstrip, stripline, CPW, or CBCPW on one of the metallization layers of the flexible antenna interface circuit 42.

Figure 3:
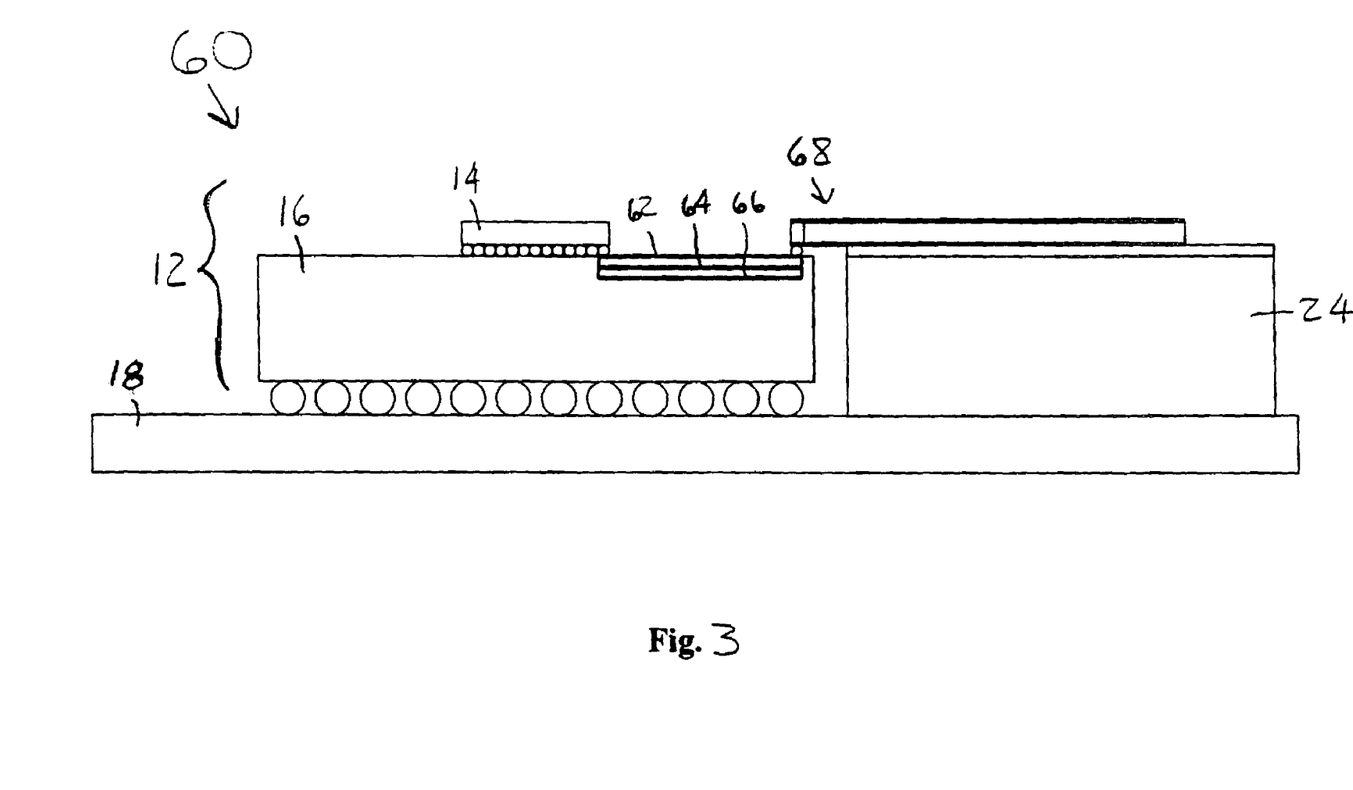
FIG. 3 is a side view of an example system having wireless capability in accordance with yet embodiment of the present invention.

FIG. 3 is a side view of an example system 60 having wireless capability in accordance with an embodiment of the present invention. In the system 60, a power amplifier impedance transformer and LNA input matching network are implemented on one or more metallization layers within the package 16. In the illustrated embodiment, for example, the power amplifier impedance transformer may be implemented on a first metallization layer 62, the LNA input matching network may be implemented on a third metallization layer 66, and a ground plane may be implemented on a second metallization layer 64 between the first and third layers 62, 66. Many other configurations may alternatively be used. An antenna circuit 68 may be coupled to the upper side of the package 16 in a similar manner to the connection of the antenna interface circuit 20 described previously. The antenna circuit 68 includes at least one antenna element for use by wireless circuitry within the microelectronic device 12 (there could be more than one antenna circuit 68 signal path). A duplexer may also be present as part of the antenna circuit 68 or within one of the layers (e.g., layers 62, 64, 66) of the package 16 of the microelectronic device 12 to permit antenna sharing between a wireless transmitter and receiver. In at least one embodiment, the antenna circuit 68 includes multiple metallization layers. In another embodiment, an antenna element (e.g., a differential excitation patch antenna) is implemented in microstrip on an upper layer of the package 16.

Figure 4:
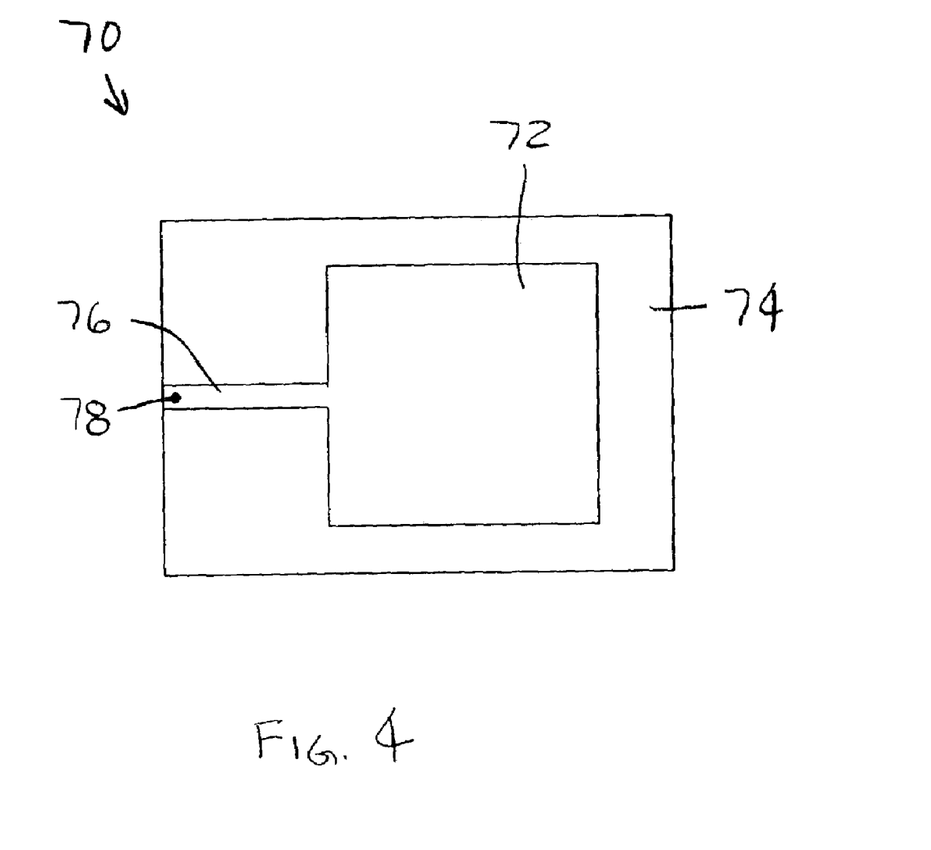
FIG. 4 is a top view of an example antenna circuit in accordance with an embodiment of the invention.

FIG. 4 is a top view of an example antenna circuit 70 in accordance with an embodiment of the invention. The antenna circuit 70 may be used, for example, within the system 60 of FIG. 3. As illustrated in FIG. 4, the antenna circuit 70 includes a microstrip patch element 72 formed over a dielectric board material 74. The antenna circuit 70 also includes an interconnect 76 to provide communication between the patch 72 and a terminal on the upper side of an associated microelectronic device package (through a via connection 78). An underside of the dielectric board 74 may include, for example, a ground plane. In at least one embodiment of the present invention, a flexible antenna circuit 70 is provided by using flexible board and metallization materials. As before, the design of the power amplifier impedance transformer, LNA input matching network, and/or the duplexer may be performed in a conventional manner.

Figure 5:
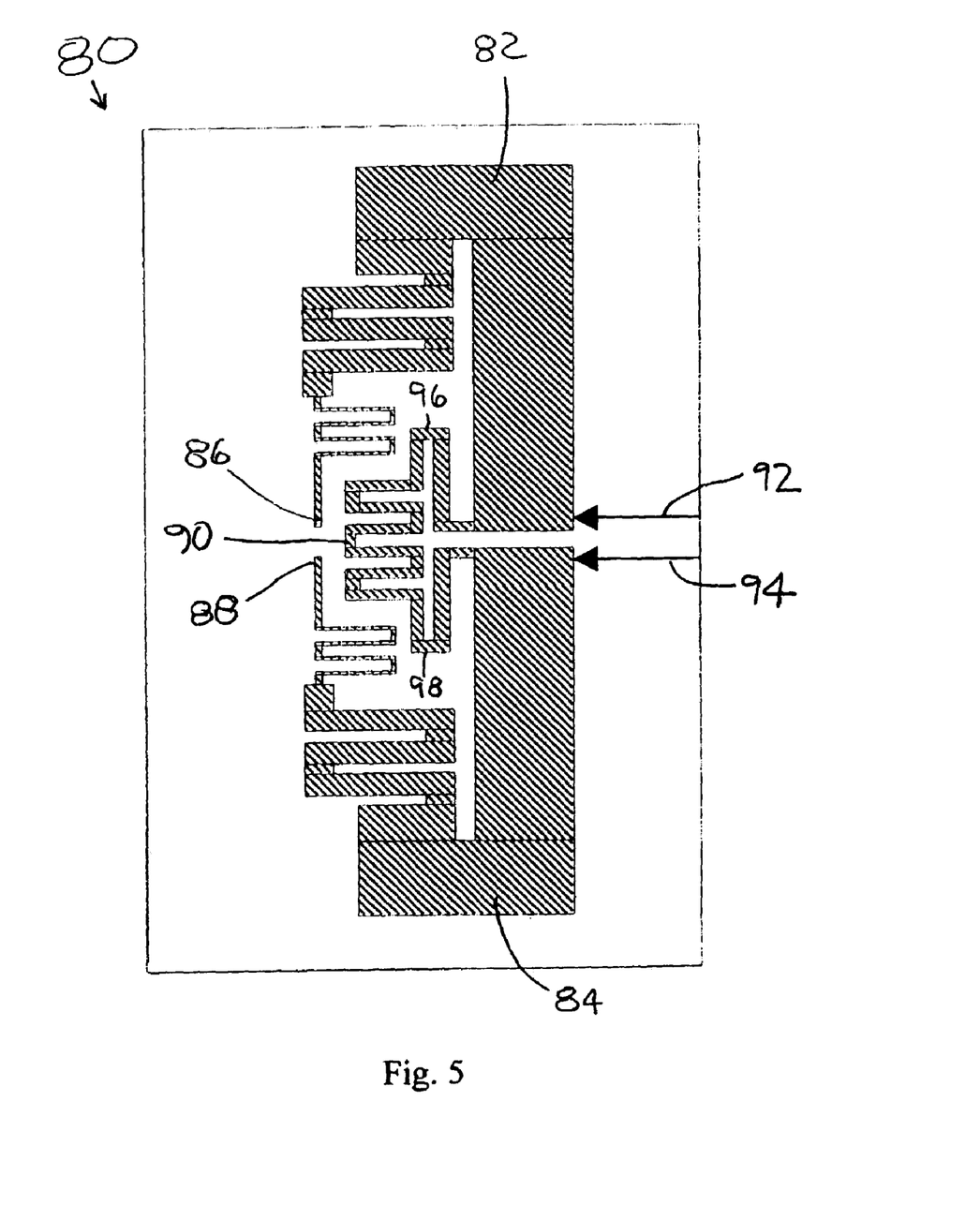
FIG. 5 is a top view of an example metallization pattern that may be included within an antenna interface circuit in accordance with an embodiment of the present invention.

In addition to radio frequency (RF) network functionality, an antenna interface circuit may also include circuitry for bringing power to active devices on the die. For example, in at least one embodiment of the invention, an antenna interface circuit may include RF chokes that connect the drains of one or more transistors on die (e.g., transistors within the power amplifier, etc.) to a power supply. FIG. 5 is a top view of an example metallization pattern 80 that may be included within an antenna interface circuit (e.g., circuit 20 of FIG. 1, circuit 42 of FIG. 2, etc.) in accordance with an embodiment of the present invention. As illustrated, the metallization pattern 80 includes first and second impedance transformers 82, 84 to provide impedance transformation between a power amplifier on die and an antenna. Interconnects 92, 94 are provided to couple the drains of two power transistors within the power amplifier to the impedance transformers 82, 84. Transmission structures 86, 88 are also provided to couple the impedance transformers 82, 84 to an antenna (or a duplexer) on another layer of the circuit (e.g., through interlayer via connections). RF chokes 96, 98 are to provided within the metallization 80 to couple the drains of the power transistors within the on die power amplifier to a power supply connected to the metallization 80 at supply node 90.

Although FIGS. 1–5 illustrate various views and embodiments of the present invention, these figures are not meant to portray microelectronic assemblies in precise detail. For example, these figures are not typically to scale. Rather, the figures illustrate microelectronic assemblies in a manner that is believed to more clearly convey the concepts of the present invention.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. An antenna interface circuit to provide an interface between a packaged microelectronic device and an antenna, comprising:
    at least one of the following on one or more substrates:
        metallization forming a power amplifier impedance transformer, metallization forming a low noise amplifier input matching circuit, and metallization forming a duplexer to couple an external transmitter and an external receiver to a common antenna; and
    at least one electrical terminal to couple said antenna interface circuit to a microelectronic device package;
    wherein said antenna interface circuit includes multiple metallization layers.

2. The antenna interface circuit of claim 1, wherein:
    said at least one electrical terminal is for direct connection to one or more corresponding terminals on a side of the microelectronic device package that has a microelectronic die mounted thereto.

3. The antenna interface circuit of claim 1, further comprising:
    metallization forming an integrated antenna.

4. The antenna interface circuit of claim 1, wherein:
    at least one of said multiple metallization layers includes a ground plane.

5. The antenna interface circuit of claim 1, wherein:
    said at least one electrical terminal includes a ball grid array (BGA).

6. An antenna interface circuit to provide an interface between a packaged microelectronic device and an antenna, comprising:
    at least one of the following on one or more substrates:
        metallization forming a power amplifier impedance transformer, metallization forming a low noise amplifier input matching circuit, and metallization forming a duplexer to couple an external transmitter and an external receiver to a common antenna;
    at least one electrical terminal to couple said antenna interface circuit to a microelectronic device package; and
    at least one electrical terminal to couple said antenna interface circuit to an external antenna.

7. An antenna interface circuit to provide an interface between a packaged microelectronic device and an antenna, comprising:
    at least one of the following on one or more substrates:
        metallization forming a power amplifier impedance transformer, metallization forming a low noise amplifier input matching circuit, and metallization forming a duplexer to couple an external transmitter and an external receiver to a common antenna; and
    at least one electrical terminal to couple said antenna interface circuit to a microelectronic device package;
    wherein metallization forming a power amplifier impedance transformer is located on one metallization layer and metallization forming a low noise amplifier input matching circuit is located on another, different metallization layer.

8. An antenna interface circuit to provide an interface between a packaged microelectronic device and an antenna, comprising:
- at least one of the following on one or more substrates: metallization forming a power amplifier impedance transformer, metallization forming a low noise amplifier input matching circuit, and metallization forming a duplexer to couple an external transmitter and an external receiver to a common antenna; and
- at least one electrical terminal to couple said antenna interface circuit to a microelectronic device package;
- wherein said antenna interface circuit is flexible.

9. An antenna interface circuit to provide an interface between a packaged microelectronic device and an antenna, comprising:
- at least one of the following on one or more substrates: metallization forming a power amplifier impedance transformer, metallization forming a low noise amplifier input matching circuit, and metallization forming a duplexer to couple an external transmitter and an external receiver to a common antenna;
- at least one electrical terminal to couple said antenna interface circuit to a microelectronic device package; and
- metallization forming at least one radio frequency choke to couple a transistor within the packaged microelectronic device to a power supply.

10. An antenna interface circuit to provide an interface between a packaged microelectronic device and an antenna, comprising:
- first metallization forming a power amplifier impedance transformer, second metallization forming a low noise amplifier input matching circuit, and third metallization forming a duplexer to couple an external transmitter and an external receiver to a common antenna, said first metallization being connected to said third metallization and said second metallization being connected to said third metallization, wherein said first, second, and third metallizations are on one or more substrates;
- at least one electrical terminal to couple said first metallization to a microelectronic device; and
- at least one electrical terminal to couple said second metallization to the microelectronic device.

11. The antenna interface circuit of claim 10, further comprising:
- at least one electrical terminal to connect said third metallization to an external antenna.

12. The antenna interface circuit of claim 10, further comprising:
- fourth metallization, connected to said third metallization, forming an integrated antenna.

13. The antenna interface circuit of claim 10, wherein:
- said antenna interface circuit includes multiple metallization layers, wherein said first metallization is located on a first metallization layer and said second metallization is located on a second, different metallization layer.

14. The antenna interface circuit of claim 13, further comprising:
- a ground plane located on a third metallization layer, said third metallization layer being located between said first metallization layer and said second metallization layer.

15. The antenna interface circuit of claim 10, wherein:
- said antenna interface circuit is flexible.

16. A system comprising:
- a microelectronic device including: (a) a package having an upper side and a lower side, and (b) at least one microelectronic die having wireless circuitry therein mounted on said upper side of said package, wherein said lower side of said package includes a plurality of terminals to couple said package to a circuit board and said upper side of said package includes at least one terminal to provide communication with an external antenna; and
- an antenna interface circuit to provide an interface between said microelectronic device and an antenna, said antenna interface circuit having at least one terminal that is connected to said at least one terminal on said upper side of said package;
- wherein said antenna interface circuit includes power amplifier impedance transformer circuitry.

17. The system of claim 16, wherein:
said antenna interface circuit includes low noise amplifier input matching circuitry.

18. The system of claim 16, wherein:
said antenna interface circuit includes duplexer circuitry to allow a wireless transmitter and a wireless receiver within said microelectronic device to share a common antenna.

19. The system of claim 16, wherein:
said antenna interface circuit includes power amplifier impedance transformer circuitry, low noise amplifier input matching circuitry, and duplexer circuitry to allow a wireless transmitter and a wireless receiver within said microelectronic device to share a common antenna.

20. The system of claim 16, wherein:
said antenna interface circuit includes multiple metallization layers.

21. The system of claim 16, wherein:
said antenna interface circuit includes at least one antenna integrated therein.

22. The system of claim 16, wherein:
said at least one microelectronic die is mounted on said upper side of said package using flip chip techniques.

23. The system of claim 16, wherein:
said plurality of terminals on said lower side of said package includes at least one of: a ball grid array (BGA), a pin grid array (PGA), and a land grid array (LGA).

24. A system comprising:
- a microelectronic device including: (a) a package having an upper side and a lower side, and (b) at least one microelectronic die having wireless circuitry therein mounted on said upper side of said package, wherein said lower side of said package includes a plurality of terminals to couple said package to a circuit board and said upper side of said package includes at least one terminal to provide communication with an external antenna; and
- an antenna interface circuit to provide an interface between said microelectronic device and an antenna, said antenna interface circuit having at least one terminal that is connected to said at least one terminal on said upper side of said package;
- wherein said antenna interface circuit includes multiple metallization layers;
- wherein said antenna interface circuit includes power amplifier impedance transformer circuitry on a first metallization layer and low noise amplifier input matching circuitry on a second metallization layer, wherein said second metallization layer is different from said first metallization layer.

25. A system comprising:
a microelectronic device including: (a) a package having an upper side and a lower side, and (b) at least one microelectronic die having wireless circuitry therein mounted on said upper side of said package, wherein said lower side of said package includes a plurality of terminals to couple said package to a circuit board and said upper side of said package includes at least one terminal to provide communication with an external antenna; and
an antenna interface circuit to provide an interface between said microelectronic device and an antenna, said antenna interface circuit having at least one terminal that is connected to said at least one terminal on said upper side of said package;
wherein said antenna interface circuit is coupled to an external antenna.

26. A system comprising:
a microelectronic device including: (a) a package having an upper side and a lower side, and (b) at least one microelectronic die having wireless circuitry therein mounted on said upper side of said package, wherein said lower side of said package includes a plurality of terminals to couple said package to a circuit board and said upper side of said package includes at least one terminal to provide communication with an external antenna; and
an antenna interface circuit to provide an interface between said microelectronic device and an antenna, said antenna interface circuit having at least one terminal that is connected to said at least one terminal on said upper side of said package;
wherein said antenna interface circuit is flexible.

27. A system comprising:
a patch antenna; and
an antenna interface circuit to provide an interface between a microelectronic device and said patch antenna, said antenna interface circuit including:
first metallization forming a power amplifier impedance transformer, second metallization forming a low noise amplifier input matching circuit, and third metallization forming a duplexer to couple an external transmitter and an external receiver to said patch antenna, said first metallization being connected to said third metallization and said second metallization being connected to said third metallization, wherein said first, second, and third metallizations are on one or more substrates;
at least one electrical terminal to couple said first metallization to a microelectronic device; and
at least one electrical terminal to couple said second metallization to the microelectronic device.

28. The system of claim 27, wherein:
said antenna interface circuit includes multiple metallization layers, wherein said first metallization is located on a first metallization layer and said second metallization is located on a second, different metallization layer.

29. The system of claim 28, further comprising:
a ground plane located on a third metallization layer of said antenna interface circuit, said third metallization layer being located between said first metallization layer and said second metallization layer.

30. The system of claim 27, wherein:
said antenna interface circuit is flexible.

31. A microelectronic device comprising:
a package having an upper side and a lower side; and
at least one microelectronic die having wireless circuitry therein mounted to said upper side of said package;
wherein said lower side of said package includes a plurality of terminals to couple said package to a circuit board and said upper side of said package includes at least one terminal to couple said microelectronic device to an external antenna;
wherein said at least one terminal on said upper side of said package includes at least one terminal to connect said microelectronic device to an external power amplifier impedance transformer.

32. The microelectronic device of claim 31, wherein:
said at least one microelectronic die includes a die having both digital processing circuitry and wireless transceiver circuitry located therein.

33. The microelectronic device of claim 31, wherein:
said at least one microelectronic die is mounted to said upper side of said package using flip chip techniques.

34. The microelectronic device of claim 31, wherein:
said at least one terminal on said upper side of said package includes at least one terminal to connect said microelectronic device to an external low noise amplifier input matching circuit.

35. A microelectronic device comprising:
a package having an upper side and a lower side;
at least one microelectronic die having wireless circuitry therein mounted to said upper side of said package, wherein said lower side of said package includes a plurality of terminals to couple said package to a circuit board and said upper side of said package includes at least one terminal to couple said microelectronic device to an external antenna; and
an antenna circuit coupled to said at least one terminal on said upper side of said package, said antenna circuit including at least one microstrip antenna element.

36. The microelectronic device of claim 35, wherein:
said at least one microstrip antenna element includes a patch element.

37. The microelectronic device of claim 35, wherein:
said antenna circuit is flexible.

* * * * *